United States Patent
Waldvogel et al.

(10) Patent No.: US 6,842,341 B1
(45) Date of Patent: Jan. 11, 2005

(54) ELECTRICAL CIRCUIT APPARATUS AND METHOD FOR ASSEMBLING SAME

(75) Inventors: John M. Waldvogel, Libertyville, IL (US); Brian R. Bielick, Carpentersville, IL (US); Herman J. Miller, Algonquin, IL (US); Billy J. Van Cannon, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/677,458

(22) Filed: Oct. 2, 2003

(51) Int. Cl.[7] ................................................. H05K 7/20
(52) U.S. Cl. ...................... 361/704; 361/707; 361/760; 361/761; 257/706; 257/717
(58) Field of Search ................................. 361/704, 707, 361/719, 760–764; 257/675, 706, 712, 717

(56) References Cited

U.S. PATENT DOCUMENTS

| | | | | |
|---|---|---|---|---|
| 4,030,001 A | * | 6/1977 | Medley et al. .............. | 361/761 |
| 5,646,444 A | | 7/1997 | Bartlett et al. | |
| 6,011,692 A | * | 1/2000 | Bergstedt et al. ........... | 361/707 |
| 6,108,205 A | * | 8/2000 | Bergstedt ..................... | 361/704 |
| 6,292,374 B1 | * | 9/2001 | Johnson et al. ............. | 361/808 |
| 6,449,158 B1 | * | 9/2002 | Wang et al. ................ | 361/704 |
| 6,537,857 B2 | * | 3/2003 | Aquien et al. .............. | 438/122 |
| 6,580,316 B2 | * | 6/2003 | Olofsson et al. ............... | 330/66 |
| 6,635,958 B2 | * | 10/2003 | Bates et al. ................. | 257/703 |
| 6,787,895 B1 | * | 9/2004 | Jarcy et al. ................. | 257/698 |

* cited by examiner

Primary Examiner—Boris Chervinsky
(74) Attorney, Agent, or Firm—Valerie M. Davis

(57) ABSTRACT

An electrical circuit apparatus (300) that includes: a substrate (330) having a ground layer (336), at least one device aperture (332), and at least one solder aperture (334); a heat sink (310); and an adhesive layer (320) for mechanically coupling the heat sink to the ground layer of the substrate such that at least a portion of the substrate device aperture overlaps the heat sink, the adhesive layer having at least one device aperture and at least one solder aperture, wherein aligning the at least one substrate solder aperture with the at least one adhesive layer solder aperture and aligning the at least one substrate device aperture with the at least one adhesive layer device aperture enables solder wetting in a predetermined area between the heat sink and the ground layer of the substrate.

14 Claims, 4 Drawing Sheets

US 6,842,341 B1

ELECTRICAL CIRCUIT APPARATUS AND METHOD FOR ASSEMBLING SAME

REFERENCE TO RELATED APPLICATIONS

The present application is related to the following U.S. application commonly owned together with this application by Motorola, Inc.:

Ser. No. 10/677,456, filed Oct. 2, 2003, titled "Electrical Circuit Apparatus and Methods for Assembling Same" by Waldvogel, et al.

FIELD OF THE INVENTION

The present invention relates generally to mounting a component to a circuit board, and more specifically to mounting a power device, such as a radio frequency ("RF") transistor to a circuit board.

BACKGROUND OF THE INVENTION

When constructing power amplifiers various components must be mounted to a circuit board or substrate. One such component is a power component or power device such as, for instance, a power transistor, also referred to herein as a radio frequency (or "RF") transistor. When mounting an RF transistor that includes one or more input terminals and one or more output terminals to a circuit board with corresponding input and output signal lines, two factors must be balanced, i.e., the need for a proper electrical coupling of the device to the circuit board must be balanced against the high heat dissipation needs of the device. To provide for optimal electrical performance of the power transistor both the input and the output terminals are typically mounted using a known solder reflow process to a topside of the circuit board, and ideally with input and output signal lines to which the transistor terminals are attached are grounded as close as possible to the body of the transistor, thus providing a low inductance electrical match of the transistor to the rest of the circuit. Moreover, a sufficient thermal conduction path must be established between the RF transistor and a heat sink that is typically soldered locally to the underside of the circuit board in an area primarily surrounding the RF transistor.

There are a number of methods used for mounting a power device such as an RF transistor to a circuit board, including a hybrid manufacturing process using fixtures (i.e., a one pass solder reflow process) and a two pass solder reflow process. The hybrid manufacturing process is typically associated with ceramic circuit boards and possibly with carrier plates that serve as heat sinks. Due to the fragility of the substrate, large fixtures are usually required for its alignment and protection during processing. The use of fixtures usually forces manual processing.

One disadvantage of the hybrid manufacturing process is that it is more costly than other manufacturing methods primarily due to the added cost of the fixtures used in the process and also due to the need for a number of manual steps that generate a lower production throughput. An additional disadvantage is that manufacturing with fixtures produces a significant variation in the ground attachment relative to the signal lines to which the transistor terminals are attached.

Turning now to the two pass solder reflow process. During the first pass of the solder reflow process, a plurality of heat sinks are locally coupled to the ground layer of a circuit board in areas primarily surrounding where power components will be mounted. Thereafter, solder is placed in strategic areas on the board, and a plurality of components, including RF transistors, are mounted onto the board in a second pass of the reflow solder process. The RF power transistors are mounted on the circuit board in two regions. First, the input and output terminals of the RF transistor are mounted on the topside of the board. Second, a portion of the RF transistor is located within an aperture in the circuit board so that the RF transistor can also be coupled to at least one heat sink. During the second pass of the reflow process, the components, including the RF transistors are soldered to the circuit board and, in the case of the RF transistors, to the heat sinks.

A primary disadvantage of the two pass reflow process is that it requires one high-temperature reflow pass with a high melting temperature solder alloy, and a second subsequent reflow pass with a lower melting temperature solder allow. The first pass exposes the circuit board to high temperature, which can result in damage such as distortion. The requirement of two independent passes with different solder temperature settings limits manufacturing throughput. The two pass approach also does not lend itself well to no-lead solder because the first temperature needed to attach the heat sinks would have to exceed the elevated no-lead solder reflow temperature. This is a significant disadvantage because no-lead solder attachment may likely become a key product differentiator in the near future since some markets, especially European markets, are moving toward requiring no-lead solder attachment.

Thus, there exists a need for a cost effective method and electrical circuit apparatus wherein components, namely power devices such as RF transistors, may be mounted to a circuit board without the need for fixtures and that is compatible with a single pass solder reflow process that is compatible with, but is not limited to no-lead solder.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
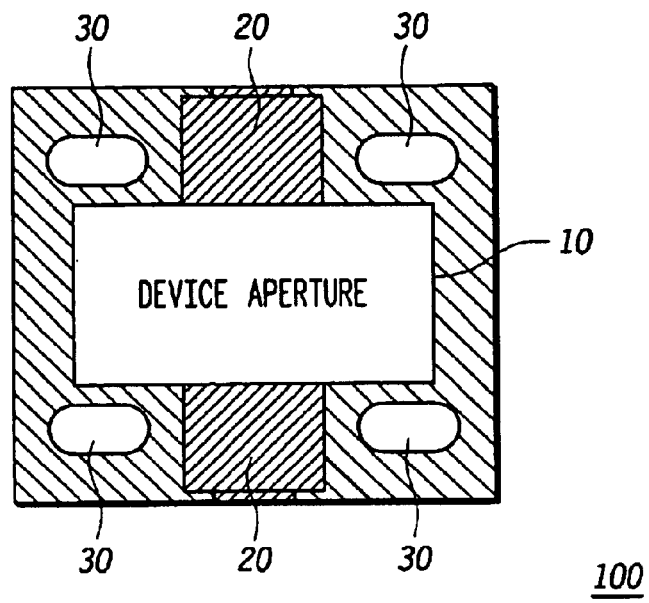
FIG. 1 illustrates a topside view of a schematic diagram of a portion of a substrate in accordance with an embodiment of the present invention.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

The present invention includes a method and electrical circuit apparatus, wherein components, namely power devices including RF transistors, may be mounted to a circuit board. The power devices are typically mounted in two regions of the circuit board, i.e., on a topside of the circuit board and within an aperture that extends through the circuit board and is perpendicular to the topside of the circuit board.

FIG. 1 illustrates a topside view of a schematic diagram of a portion of a circuit board or substrate 100 in accordance with an embodiment of the present invention. In one embodiment, substrate 100 is an organic circuit board such as a printed circuit board (PCB). However, those of ordinary skill in the art will realize that other substrates (ceramic, for example) may be incorporated. Substrate 100 includes a ground layer (not shown), which may comprise a bottom side of the substrate or may, alternatively, exist internal to the top side and the bottom side of the substrate. The ground layer is typically comprised of copper, which may be coated or plated with a variety of protective layers (e.g., organic surface coating, tin, nickel or gold).

Substrate 100 further includes a device aperture 10, which is a cut-out extending through the substrate and within which a component may be mounted. The device aperture 10 accommodates a component that may be mounted to substrate 100 in two regions, the first region being through the device aperture and the second region being on the top side of substrate 100. In one embodiment, device aperture 10 accommodates a power device such as an RF transistor or a leaded resistor. FIG. 1 shows only one device aperture for ease of illustration. However, the substrate of the present invention may incorporate additional device apertures, wherein the number of device apertures is a function of the application incorporating the substrate.

Substrate 100 may also include pads 20 for enabling a component to be mounted on the topside of substrate 100. For instance, where an RF transistor having at least one input terminal and at least one output terminal is being mounted to substrate 100, the input terminals may be coupled to the substrate at one pad 20, and the output terminals may be coupled to the substrate at the other pad 20.

Substrate 100 further includes solder apertures 30 that are cut-outs extending through the substrate for accommodating solder addition prior to solder wetting. Solder wetting is defined as the flow of molten solder due to surface tension forces along a surface or multiple surfaces away from the initial area of solder addition. The solder may be in the form of paste, pellets, etc., and may be leaded or no-lead solder. The placement, size and dimensions of the solder apertures 30 are predetermined and assist in causing solder wetting in a predetermined area, for instance, between a heat sink and the ground layer of the substrate 100. FIG. 1 illustrates four oval shaped solder apertures 30. The placement, size and dimensions of solder apertures 30 are exemplary for optimal solder wetting beneath a power transistor. However, those of ordinary skill in the art will realize that depending upon the particular component being mounted and the desired area for solder wetting, there may be more or fewer solder apertures in other locations on the substrate and having other sizes and dimensions.

Figure 2:
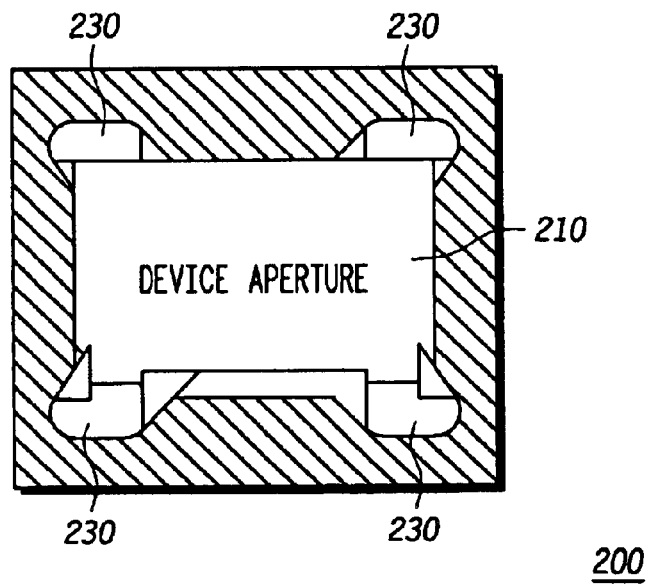
FIG. 2 illustrates a topside view of a schematic diagram of an adhesive layer in accordance with an embodiment of the present invention.

FIG. 2 illustrates a topside view of a schematic diagram of an adhesive layer 200 in accordance with an embodiment of the present invention. Adhesive layer 200 corresponds to substrate portion 100 of FIG. 1 and is used for mechanically coupling at least a portion of one heat sink to the ground layer of substrate 100 such that at least a portion of device aperture 10 overlaps the heat sink.

Adhesive layer 200 is typically comprised of a flexible material with adhesive and cohesive properties that are stable over the high temperature of the reflow soldering process. The material is typically electrically non-conducting but may also be a conducting material. In one embodiment, the material is a flexible, pressure sensitive acrylic adhesive. In another embodiment, a flexible liquid or film adhesive requiring a curing process (e.g., elevated temperature) may be used. Adhesive layer 200 may be manufactured having a predetermined thickness, the purpose of which will be discussed below. Adhesive layer 200 includes a device aperture 210 that corresponds to device aperture 10 in substrate 100. Device aperture 210 is likewise a cut-out that extends through the adhesive layer and that is essentially the same size and dimensions as device aperture 10 of substrate 100. Adhesive layer 200 further includes solder apertures 230 that correspond to solder apertures 30 in substrate 100. Solder apertures 230 are cut-outs that likewise extend through adhesive layer 200 for accommodating solder prior to solder wetting.

The placement, size and dimensions of solder apertures 230 are predetermined and are essentially the same as that of solder apertures 30 in the substrate so that the aligning of solder apertures 30 with solder apertures 230, and the aligning of device aperture 10 with device aperture 210 provides for a precise cavity for guiding and controlling solder wetting from the solder apertures (30, 230) to a predetermined area, for instance, between a heat sink and the ground layer of substrate 100. The adhesive layer may, thus, be die-cut from an adhesive film or adhesive coated film for repeatability in producing the desired thickness and shape of the adhesive layer.

Figure 3:
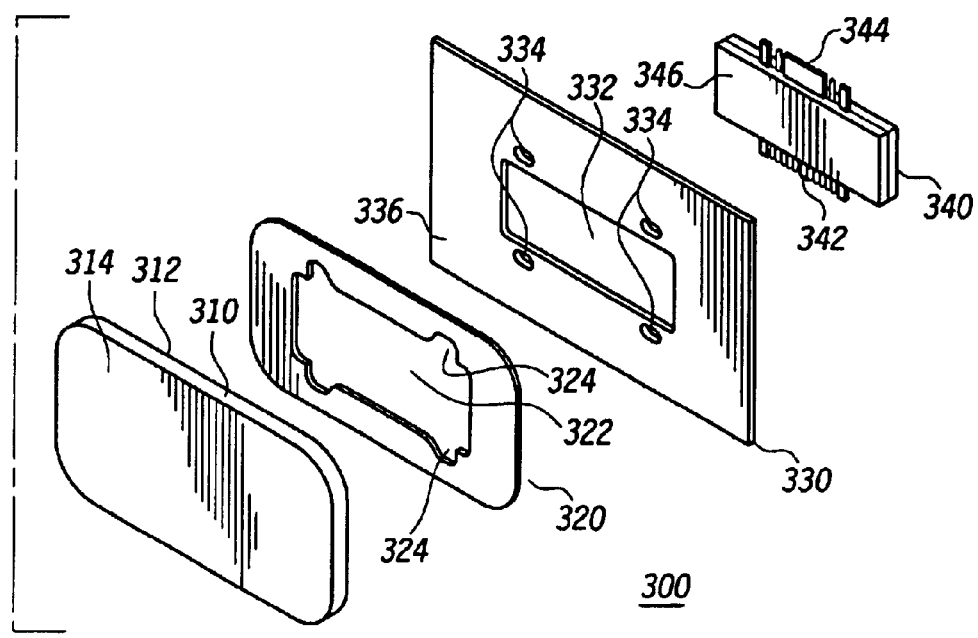
FIG. 3 illustrates an exploded view of electrical circuit apparatus including a heat sink, an adhesive layer, a substrate, and a power device in accordance with an embodiment of the present invention.

FIG. 3 illustrates an exploded view of electrical circuit apparatus 300 in accordance with an embodiment of the present invention. Circuit apparatus 300 includes a heat sink 310, an adhesive layer 320, a substrate portion 330, and a power device 340. Heat sink 310 is comprised of a suitable high thermal conductive material such as, for instance, copper or aluminum, that allows wetting of solder and attachment of adhesive materials selected for the circuit apparatus assembly process. Heat sink 310 has two primary sides 312 and 314. At side 312: substrate portion 330 is attached using adhesive layer 320; device 340 is attached using solder; and heat is input into heat sink 310 for dissipation. The opposite side 314 is the primary region of heat extraction from circuit apparatus 300, as well as the primary mounting surface for circuit apparatus 300. In one embodiment, the size of the heat sink is larger than that of the heat dissipating device (e.g., power device 340), such that desirable heat spreading can be achieved.

Adhesive layer 320 is in accordance with the adhesive layer as described by reference to FIG. 2. Accordingly, adhesive layer 320 includes a device aperture 322 and solder apertures 324. Substrate portion 330 is in accordance with the substrate portion as described by reference to FIG. 1. Accordingly, substrate portion 330 includes a device aperture 332, solder apertures 334, and a ground layer 336. Substrate 330 also typically includes a plurality of pads (not shown) on the topside of the substrate onto which the power device 340 may be coupled. In the embodiment illustrated in FIG. 3, ground layer 336 comprises the bottom side of substrate 330. However, it is realized that ground layer 336 may be internal to substrate 330, wherein substrate 330 would further include a recess for exposing said ground layer, the recess typically having dimensions that are slightly larger than that of heat sink 310. Finally, power device 340 may comprise at least one input terminal 342, at least one output terminal 344, and a ground portion or flange 346. In one embodiment, power device 340 is an RF transistor. However, it is appreciated the power device 340 may also be any power device that is mounted in two regions on the substrate portion 330.

The above-described elements of circuit apparatus 300 may be assembled as follows in accordance with the present invention. Adhesive layer 320 is aligned with substrate 330 such that device aperture 322 is aligned with device aperture 332 and solder apertures 324 are aligned with solder apertures 334. Heat sink 310 is mechanically coupled to the ground layer 336 of substrate 330 using adhesive layer 320, such that it is aligned with substrate 330 and at least a portion of device apertures 322 and 332 overlap heat sink 310. In the embodiment illustrated in FIG. 3, heat sink 310 is coupled locally to substrate 330 in an area that completely surrounds power device 340 for providing an optimal thermal conduction path.

Solder is placed on the substrate pads, into at least a portion of the adhesive layer device aperture 322 and into at least a portion of the adhesive layer solder apertures 324 for subsequent solder wetting to couple the device input and output terminals (342, 344) to the pads, to couple the device flange 346 to the heat sink 310 and to produce grounding of the power device 340. Typically, solder paste is screen-printed on the substrate pads and into the adhesive layer device aperture 322 and solder apertures 324. However, in other embodiments, other forms of solder, e.g., solder pellets or pre-forms, may be implemented. It is further appreciated that during solder addition, solder may also be added to at least a portion of the substrate device aperture 332 and solder apertures 334. In fact, typically both the substrate and adhesive layer solder apertures (324, 334) are filled during solder addition.

The power device 340 is mounted onto both the topside of substrate 330 and into the substrate device aperture 332 such that at least one input terminal 342 comes into contact with the solder on the corresponding pads on the topside of substrate 330; at least one output terminal 344 comes into contact with the solder on the corresponding pads on the topside of substrate 330; and the device flange 346 comes into contact with the solder in the adhesive layer device aperture 322. Population of the substrate 330 with the device 340 may be done manually, but is typically done using an automated process for efficiency and cost effectiveness during the manufacturing process.

The populated substrate 330 may be placed in a reflow oven and thereafter cooled, wherein a solder connection between the device terminals (342, 344) and the pads and between the device flange 346 and heat sink 310 is completed, and solder wets from the solder apertures (324, 334) into the cavity between the ground layer 336 and the heat sink 310 to complete the grounding of the power device 340.

In one embodiment, at least a portion of the steps of the method according to the present invention described above may be performed as part of an automated process, and ideally all of the steps are so performed. However, it is realized that any of the above described steps in various combinations may be performed manually or as part of an automated process.

Mechanical attachment of the heat sink to the substrate prior to reflow eliminates the need for fixtures to hold the heat sink in place during the surface mount technology (SMT) processing and adds robustness during the assembly process for handling of the circuit apparatus assembly. Assembly of the electrical circuit apparatus may be performed during a single pass reflow process for the thermal coupling and topside SMT attachment, thereby lending itself well with the use of no-lead solder or leaded solder.

The adhesive layer solder apertures, the substrate ground layer and the wettable heat sink surface promote wetting of solder from the solder apertures to areas of critical RF grounding during reflow. High surface energy surfaces above (substrate ground layer) and below (heat sink) promote the wetting of solder to the open space between the two wettable surfaces. These surfaces also provide ideal adhesive bonding surfaces yielding high adhesion strength between the heat sink and the substrate.

Use of a film adhesive with controlled thickness produces a highly repeatable separation, resulting in lower variation of this critical dimension for the manufacturing process. The natural venting feature created by the device apertures for the body of the transistor further promotes optimal solder filling by allowing solder paste volatiles to escape. The size and shape of the solder apertures for the paste also defines the volume of molten solder to fill the separation and is easily controlled to optimize RF grounding. The combination of this control of solder volume and the termination of the region of two high surface energy surfaces created by the device aperture and cut-outs in the adhesive restricts the flow of molten solder to the region of interest. The resulting ground layer-to-heat sink solder connection produces repeatable RF ground paths for the signal lines to which the RF transistor's terminals are attached, wherein the ground paths are near the body of the device for optimal electrical performance.

Since the bulk of the attachment of the heat sink to the substrate is accomplished using a low-stiffness adhesive, thermal expansion differences between the heat sink and matching components on top of the substrate (e.g., ceramic components, such as RF matching capacitors, that have a much lower coefficient of thermal expansion than the heat sink) are decoupled, thus improving the reliability of the components and corresponding solder joints. Moreover, the device apertures enable a good thermal conduction path between the ground flange of the power device and the heat sink.

FIG. 3, for simplicity, illustrates a portion of a substrate having one component mounted thereon using methods described above in accordance with the present invention. However, those of ordinary skill in the art will realize that a substrate typically has a plurality of components mounted thereon and includes both power components and other components. Those of ordinary skill in the art will further realize that although FIG. 3 illustrates heat sink 310 being coupled locally to substrate 330 beneath only one power device 340, typically heat sink 310 is coupled locally beneath a plurality of power devices for efficiency in manufacturing and to minimize manufacturing costs. In addition, FIG. 3 only shows one heat sink being coupled to substrate 330. However, it is appreciated that a plurality of heat sinks may be coupled to the substrate.

Figure 4:
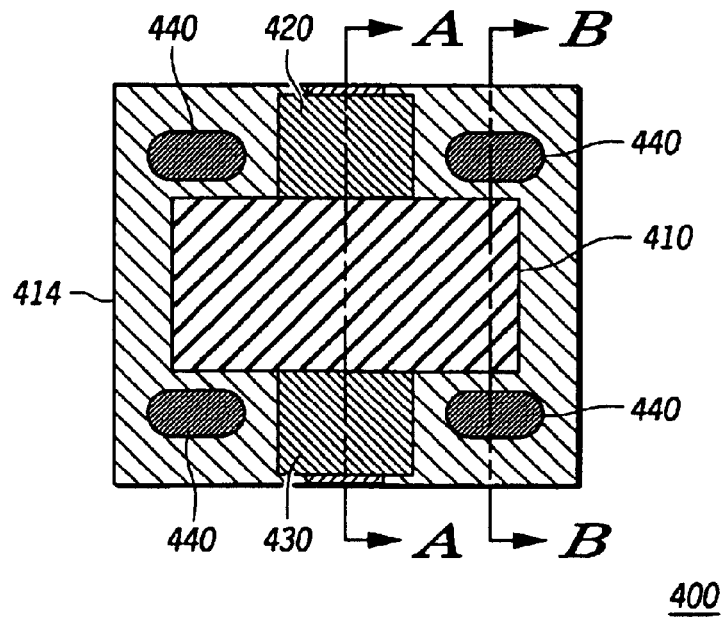
FIG. 4 illustrates an assembled topside view of electrical circuit apparatus in accordance with an embodiment of the present invention.

FIG. 4 illustrates an assembled topside view of an electrical circuit apparatus 400, in accordance with the electrical circuit apparatus illustrated in FIG. 3, subsequent to a solder paste screening and device population but prior to solder wetting. Illustrated in FIG. 4 is the topside of a power device 4 that has been mounted onto a substrate 414, wherein the topside of at least one device input terminal 420 and at least one device output terminal 430 have made contact with the solder on the input and output pads (not shown) on the topside of the substrate 414. Also illustrated are four solder apertures 440 that have been filled with solder using known methods, and a cross-section line labeled A—A and one labeled B—B that illustrate different cross-sectional areas of the electrical circuit apparatus 400 that will be discussed in detail by reference to FIGS. 5–8.

Figure 5:
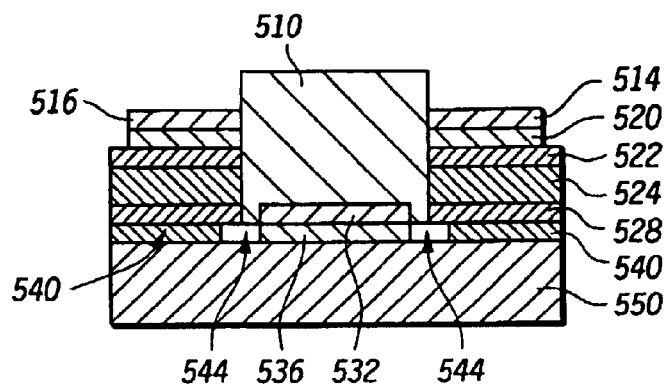
FIG. 5 illustrates a cross-sectional view at a section A—A of the electrical circuit apparatus illustrated in FIG. 4 prior to solder wetting.

FIG. 5 illustrates a cross-sectional view at a section A—A of the electrical circuit apparatus 400 illustrated in FIG. 4 prior to solder wetting. This cross-sectional view illustrates a power device 510 having at least one input terminal 514 and at least one output terminal 516 coupled to pads 522 on a substrate 524 via a solder layer 520. At least a portion of power device 510 is mounted through electrical circuit apparatus 400 such that a ground flange 532 of device 510 is coupled to a heat sink 550 via a solder layer 536. Further illustrated is a ground layer 528 of substrate 524 mechanically coupled to heat sink 550 via an adhesive layer 540, wherein the adhesive layer 540 creates precise cavities 544 between the ground layer 528 and heat sink 550.

Figure 6:
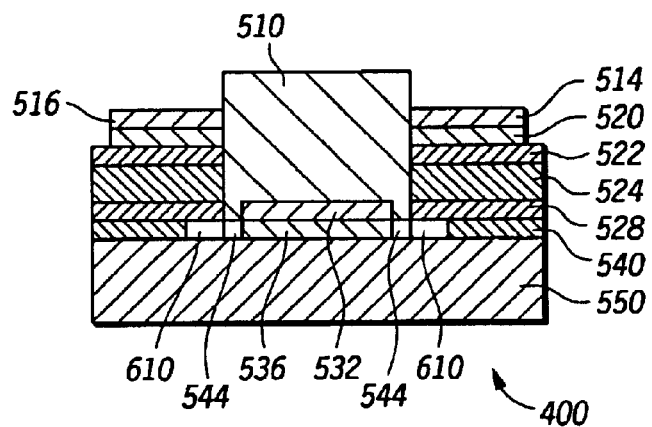
FIG. 6 illustrates a cross-sectional view at a section A—A of the electrical circuit apparatus illustrated in FIG. 4 subsequent to solder wetting.

FIG. 6 illustrates a cross-sectional view at a section A—A of the electrical circuit apparatus 400 illustrated in FIG. 4 subsequent to solder wetting. Those elements that are identical to the elements illustrated in FIG. 5 are correspondingly identically labeled in FIG. 6 and for the sake of brevity and are not described again here. FIG. 6, however, further illustrates solder wetting 610 in the cavities 544 in an area between the ground layer 528 of the substrate 524 and the heat sink 550, for grounding the input and output signal lines of the substrate (not shown), to which the input and output terminals (514, 516) are attached, close to the body of power device 510.

Figure 7:
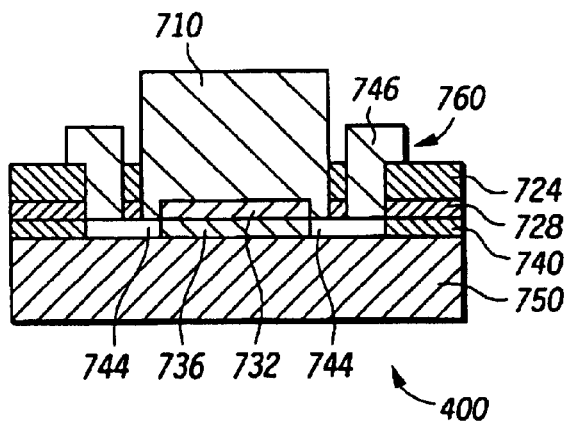
FIG. 7 illustrates a cross-sectional view at a section B—B of the electrical circuit apparatus illustrated in FIG. 4 prior to solder wetting.

FIG. 7 illustrates a cross-sectional view at a section B—B of the electrical circuit apparatus 400 illustrated in FIG. 4 prior to solder wetting. This cross-sectional view illustrates a power device 710, wherein at least a portion of power device 710 is mounted through electrical circuit apparatus 400 such that a ground flange 732 of device 710 is coupled to a heat sink 750 via a solder layer 736. A substrate 724 is illustrated having a ground layer 728 mechanically coupled to heat sink 750 via an adhesive layer 740, wherein the adhesive layer 740 creates precise cavities 744 between the ground layer 728 and heat sink 750. Further illustrated is solder 760 that has been placed using known methods into solder apertures 746.

Figure 8:
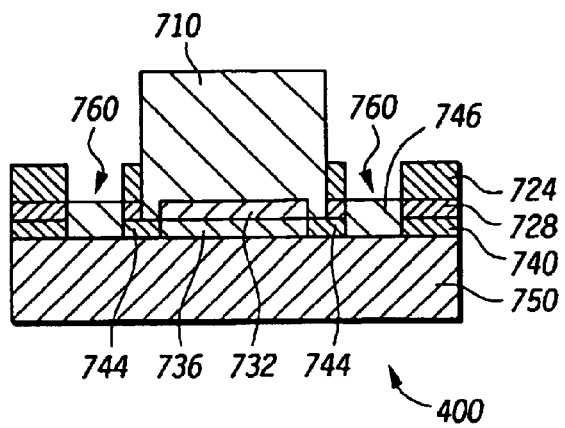
FIG. 8 illustrates a cross-sectional view at a section B—B of the electrical circuit apparatus illustrated in FIG. 4 subsequent to solder wetting.

FIG. 8 illustrates a cross-sectional view at a section B—B of the electrical circuit apparatus 400 illustrated in FIG. 4 subsequent to solder wetting. Those elements that are identical to the elements illustrated in FIG. 7 are correspondingly identically labeled in FIG. 8 and for the sake of brevity and are not described again here. FIG. 8 further illustrates solder wetting of the solder 760 from solder apertures 746 into the cavities 744 in an area between the ground layer 728 of the substrate 724 and the heat sink 750, close to the body of power device 710.

Figure 9:
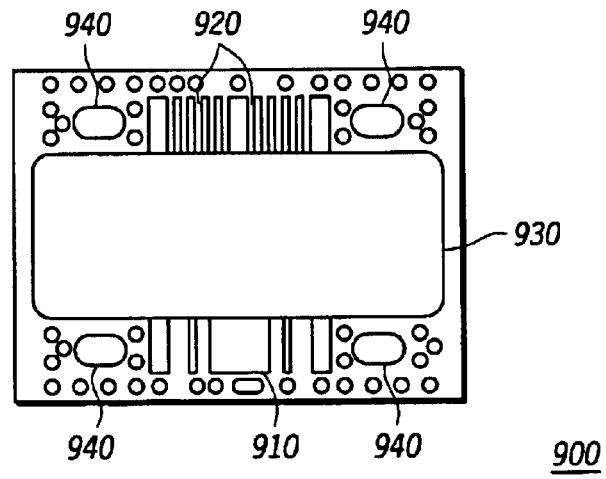
FIG. 9 illustrates a topside view of a portion of an actual substrate in accordance with the present invention.

FIG. 9 illustrates a topside view of a portion of an actual substrate 900 in accordance with the present invention prior to, for instance, solder paste screening and prior to population by a power device. A plurality of input pads 910 and output pads 920 are illustrated in FIG. 9. Also illustrated is a device aperture 930 and solder apertures 940.

Figure 10:
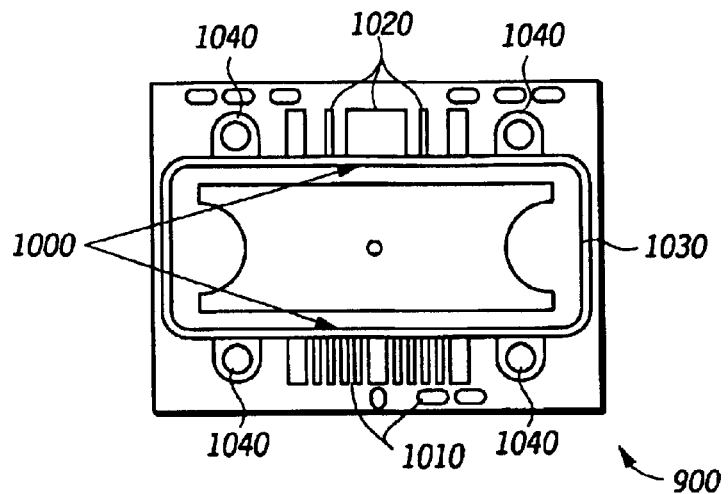
FIG. 10 illustrates an X-Ray image of the substrate of FIG. 9 after device population and reflow soldering.

FIG. 10 illustrates an X-Ray image of the substrate 900 after device population and reflow soldering. This view illustrates the solder attachment at various areas on a heat sink that is coupled to substrate 900. This X-Ray image clearly shows how solder has wetted from solder apertures 1040 to produce ideal solder connections 1000 between the ground layer of the substrate 900 and the heat sink in an area under input terminals 1010 and output terminals 1020 of a power device 1030, wherein the solder connections 1000 are close to the body of the power device 1030. Moreover a good solder connection 1050 between the device flange and the heat sink can be seen.

A number of exemplary advantages over the prior art can be realized using the method and electrical circuit apparatus of the present invention, wherein power devices may be mounted to a circuit board. These advantages include, but are not limited to: (1) repeatable solder attachment of a power device in two planes or regions (i.e., at the input and output terminals and at the ground flange); (2) a good thermal path from the bottom of the power device, though its ground flange, to a heat sink directly below; (3) repeatable solder attachment of the ground layer of the circuit board to the heat sink, the solder attachment being under the input and output terminals and as close as possible to the body of the power device; (4) mechanical attachment of the heat sink to the circuit board to add robustness to assembly for handling and subsequent module assembly; (5) elimination of the need for fixtures in a one-step or single pass reflow soldering process that lends itself to no-lead solder or leaded solder; and (6) assembly can be accomplished during SMT attachment of other components to the circuit board without requiring additional process steps.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

What is claimed is:

1. An electrical circuit apparatus comprising;
 a substrate comprising a ground layer, at least one device aperture, and at least one solder aperture;
 a heat sink; and
 an adhesive layer for mechanically coupling said heat sink to the ground layer of said substrate such that at least a portion of the substrate device aperture overlaps said heat sink, said adhesive layer comprising at least one device aperture and at least one solder aperture, wherein aligning the at least one substrate solder aperture with the at least one adhesive layer solder aperture and aligning the at least one substrate device aperture with the at least one adhesive layer device aperture enables solder wetting in a predetermined area between said heat sink and the ground layer of said substrate.

2. The apparatus of claim 1 further comprising a device coupled to said heat sink, wherein at least a portion of said device is located within the substrate device aperture.

3. The apparatus of claim 2, wherein said device is a power device comprising at least one input terminal and at least one output terminal, and at least a portion of said predetermined area is located beneath said power device.

4. The apparatus of claim 3, wherein a first portion of said predetermined area is located beneath said at least one input terminal and a second portion of said predetermined area is located beneath said at least one output terminal.

5. The apparatus of claim 2, wherein said device is a power transistor.

6. The apparatus of claim 2, wherein said device is coupled to said heat sink and said solder wetting occurs during a single pass solder reflow process.

7. The apparatus of claim 6, wherein said solder reflow process uses a no-lead solder.

8. The apparatus of claim 6, wherein said solder reflow process uses a leaded solder.

9. The apparatus of claim 1, wherein said adhesive layer comprises an electrically non-conducting material.

10. The apparatus of claim 9, wherein said electrically non-conductive material is acrylic.

11. The apparatus of claim 1, wherein said substrate is an organic circuit board.

12. The apparatus of claim 1, wherein said adhesive layer has a predetermined thickness.

13. An electrical circuit apparatus comprising;

a substrate comprising a ground layer, at least one device aperture, and at least one solder aperture;

a heat sink;

an adhesive layer for mechanically coupling said heat sink to the ground layer of said substrate such that at least a portion of the substrate device aperture overlaps said heat sink, said adhesive layer comprising at least one device aperture and at least one solder aperture; and a device coupled to said heat sink, wherein at least a portion of said device is located within the substrate device aperture, and wherein aligning the at least one substrate solder aperture with the at least one adhesive layer solder aperture and aligning the at least one substrate device aperture with the at least one adhesive layer device aperture enables solder wetting in a predetermined area between said heat sink and the ground layer of said substrate, and wherein at least a portion of said predetermined area is located beneath said device.

14. An electrical circuit apparatus comprising;

an organic circuit board comprising a ground layer, at least one device aperture, and at least one solder aperture;

a heat sink;

an adhesive layer for mechanically coupling said heat sink to the ground layer of said substrate such that at least a portion of the substrate device aperture overlaps said heat sink, said adhesive layer having a predetermined thickness and comprising at least one device aperture and at least one solder aperture; and a power transistor comprising at least one input terminal and at least one output terminal and coupled to said heat sink, wherein at least a portion of said power transistor is located within the substrate device aperture, and wherein aligning the at least one substrate solder aperture with the at least one adhesive layer solder aperture and aligning the at least one substrate device aperture with the at least one adhesive layer device aperture enables solder wetting in a predetermined area between said heat sink and the ground layer of said substrate, and wherein a first portion of said predetermined area is located beneath said at least one input terminal and a second portion of said predetermined area is located beneath said at least one output terminal of said power transistor.

* * * * *